(12) United States Patent
Huangfu et al.

(10) Patent No.: US 9,946,123 B2
(45) Date of Patent: Apr. 17, 2018

(54) PIXEL ARRANGEMENT STRUCTURE, DISPLAY PANEL AND DISPLAY DEVICE

(71) Applicant: BOE TECHNOLOGY GROUP CO., LTD., Beijing (CN)

(72) Inventors: Lujiang Huangfu, Beijing (CN); Xiaodan Jin, Beijing (CN); Yinan Liang, Beijing (CN); Kelvin Chiang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/917,200

(22) PCT Filed: Jul. 30, 2015

(86) PCT No.: PCT/CN2015/085510
§ 371 (c)(1),
(2) Date: Mar. 7, 2016

(87) PCT Pub. No.: WO2016/127593
PCT Pub. Date: Aug. 18, 2016

(65) Prior Publication Data
US 2016/0357076 A1 Dec. 8, 2016

(30) Foreign Application Priority Data
Feb. 13, 2015 (CN) .......................... 2015 1 0080570

(51) Int. Cl.
*H01L 29/20* (2006.01)
*H01L 33/00* (2010.01)
(Continued)

(52) U.S. Cl.
CPC ...... *G02F 1/134336* (2013.01); *G02F 1/1368* (2013.01); *G02F 1/13439* (2013.01);
(Continued)

(58) Field of Classification Search
CPC .................................................. G02F 1/134336
(Continued)

(56) References Cited

U.S. PATENT DOCUMENTS

| 4,652,912 A | 3/1987 | Masubuchi |
| 5,689,283 A | 11/1997 | Shirochi |

(Continued)

FOREIGN PATENT DOCUMENTS

| CN | 1731245 A | 2/2006 |
| CN | 103185995 A | 7/2013 |

(Continued)

OTHER PUBLICATIONS

Office Action in Chinese Patent Application No. 201510080570.0, dated Dec. 16, 2016.
(Continued)

*Primary Examiner* — Igwe U Anya
(74) *Attorney, Agent, or Firm* — Brooks Kushman P.C.

(57) ABSTRACT

The present disclosure provides a pixel arrangement structure, a display panel and a display device. The pixel arrangement structure includes a plurality of first sub-pixels, a plurality of second sub-pixels and a plurality of third sub-pixels. Each pixel includes one first sub-pixel, each second sub-pixel is shared by at least two adjacent pixels and each third sub-pixel is shared by at least two adjacent pixels. A density of the sub-pixels is 1.5 times larger than a density of the pixels in a first direction of a pixel array, and a density of the sub-pixels is 1.5 times larger than a density of the pixels in a second direction of the pixel array. The first direction is different from the second direction.

15 Claims, 4 Drawing Sheets

(51) Int. Cl.
*G02F 1/1343* (2006.01)
*G02F 1/1368* (2006.01)
*H01L 27/32* (2006.01)

(52) U.S. Cl.
CPC .... *G02F 1/134309* (2013.01); *H01L 27/3218* (2013.01); *G02F 2001/134345* (2013.01); *G02F 2201/52* (2013.01)

(58) Field of Classification Search
USPC .......................................................... 257/89
See application file for complete search history.

(56) References Cited

U.S. PATENT DOCUMENTS

| | | | |
|---|---|---|---|
| 8,754,913 | B2 | 6/2014 | Hwang |
| 2008/0225143 | A1* | 9/2008 | Joffer ................... G09G 3/2003 348/280 |
| 2011/0127506 | A1* | 6/2011 | So ....................... H01L 27/3213 257/40 |
| 2011/0260952 | A1 | 10/2011 | Hwang |
| 2011/0291549 | A1 | 12/2011 | Kim |
| 2013/0234917 | A1 | 9/2013 | Lee |
| 2014/0111115 | A1 | 4/2014 | Bai |
| 2015/0364525 | A1* | 12/2015 | Lin ..................... H01L 27/3213 257/40 |

FOREIGN PATENT DOCUMENTS

| | | |
|---|---|---|
| CN | 103278960 A | 9/2013 |
| CN | 103325315 A | 9/2013 |
| CN | 103680398 A | 3/2014 |
| CN | 103681754 A | 3/2014 |
| CN | 104009063 A | 8/2014 |
| CN | 104282727 A | 1/2015 |
| CN | 104597655 A | 5/2015 |
| JP | 2005091875 A | 4/2005 |
| KR | 20130101874 A | 9/2013 |

OTHER PUBLICATIONS

Office Action in Korean Patent Application No. 10-2016-7005052, dated Sep. 5, 2016.
Written Opinion of the International Searching Authority, dated Nov. 30, 2015.

* cited by examiner

PIXEL ARRANGEMENT STRUCTURE, DISPLAY PANEL AND DISPLAY DEVICE

CROSS-REFERENCE TO RELATED APPLICATION

This application is the U.S. national phase of PCT Application No. PCT/CN2015/085510 filed on Jul. 30, 2015, which claims a priority to Chinese Patent Application No. 201510080570.0 filed on Feb. 13, 2015, the disclosures of which are incorporated in their entirety by reference herein.

TECHNICAL FIELD

The present disclosure relates to the field of display, and in particular to a pixel arrangement structure, a display panel and a display device.

BACKGROUND

Along with the development of the display technology, a requirement of the display resolution ratio is improved. However, a manufacturing process of the displayer may be more difficult and a manufacturing cost thereof may be increased due to a high resolution ratio. When the display resolution ratio is equivalent to a resolution ratio of the human eyes, the way to simply define a pixel by a red (R) sub-pixel, a green (G) sub-pixel and a blue (B) sub-pixel may be changed because the resolution ratio of the human eyes for different colors of sub-pixels is varied. In another word, by sharing by different pixels the sub-pixel of a color which the resolution ratio of a certain position is not sensitive to, a performance ability of a pixel resolution ratio may be simulated by a relative small amount of sub-pixels, thereby simplifying the process and reducing the cost.

With an instruction of the Retina screen of Iphone and the improvement of other high-definition display technologies, the resolution ratio level of the corresponding displayer is closing to, achieving or even beyond a resolution ratio limitation of the human eyes. According to a physiological structure of the human eyes, the said limitation is determined by a density of pole-like photoreceptor cells in the human retina which are sensitive to a luminance. A density of pyramidal photoreceptor cells in the human retina which are sensitive to different colors is lower than the density of the pole-like photoreceptor cells in the human retina. The density of the pyramidal cells sensitive to the blue light with a short wave length is the lowest, the red light comes second, and luminance effects (stimulation to the pole-like cells sensitive to the luminance) of the blue and the red light is far lower than that of the green light, therefore the resolution ratios of the human eyes for positions of the blue and the red sub-pixels are significantly lower solution ratios of the human eyes for positions of the green sub-pixels and a luminance center of the pixels. In a certain pixel luminance ratio, although the human eyes may identify the luminance center of the pixels and sensitive to the colors normally, the human eyes may not identify the positions or boundaries of the blue or the red sub-pixels on a pixel scale, thereby it is possible to share adjacent blue sub-pixels and adjacent red sub-pixels among adjacent pixels to some extent.

Figure 1:
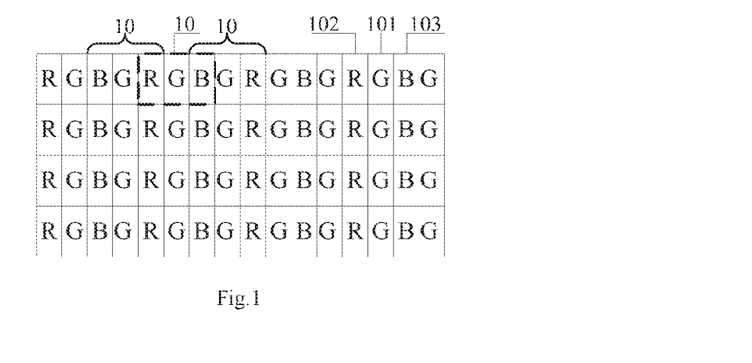
FIG. 1 is a schematic view showing an arrangement of red, green and blue sub-pixels in a pixel arrangement structure according to the related art.

As shown in FIG. 1, in the related art, groups including a red sub-pixel, a green sub-pixel, a blue sub-pixel and a green sub-pixel are arranged circularly in a row direction. Each pixel 10 includes an independent green sub-pixel 101, and a red sub-pixel 102 is shared by two adjacent pixels 10 and a blue sub-pixel 103 is shared by two adjacent pixels 10, therefore a density of the sub-pixels is twice a density of the pixels in the row direction, and a density of the sub-pixels is equal to a density of the pixels in the column direction.

Based on this, although a resolution ratio may be realized by a relative small amount of sub-pixels, a density of the sub-pixels is still twice a density of the pixels in the row direction, and then the requirement of the process is still high.

SUMMARY

A pixel arrangement structure, a display panel and a display device are provided by some embodiments of the present disclosure, by which a manufacturing process of a display panel may be simplified.

To achieve the objective hereinabove, the technical solution of the present disclosure is provided as follows.

In a first aspect, a pixel arrangement structure is provided, including a plurality of first sub-pixels, a plurality of second sub-pixels and a plurality of third sub-pixels; each pixel includes one first sub-pixel, each second sub-pixel is shared by at least two adjacent pixels and each third sub-pixel is shared by at least two adjacent pixels; a density of the sub-pixels is 1.5 times larger than a density of the pixels in a first direction of a pixel array, and a density of the sub-pixels is 1.5 times larger than a density of the pixels in a second direction of the pixel array; wherein the first direction is different from the second direction.

Optionally, the first direction is a horizontal direction and the second direction is a vertical direction.

Optionally, the first sub-pixel is a green sub-pixel, the second sub-pixel is a red sub-pixel, and the third sub-pixel is a blue sub-pixel.

Optionally, every two adjacent green sub-pixels are arranged in pairs in the first direction; wherein at least one sub-pixel of a color other than green is arranged between every two adjacent pairs of the green sub-pixels.

Optionally, two adjacent green sub-pixels are arranged in pairs in the second direction; one red sub-pixel is arranged between every two adjacent pairs of the green sub-pixels in the first direction, and one blue sub-pixel is arranged between every two adjacent pairs of the green sub-pixels in the second direction.

Optionally, every two adjacent blue sub-pixels are arranged in pairs.

Optionally, every two adjacent blue sub-pixels are combined as one blue sub-pixel and driven by one drive circuit.

Optionally, the first direction is a horizontal direction and the second direction is a vertical direction; in each odd-numbered row of the pixel array, the green sub-pixels of each pair of the green sub-pixels are arranged at different sides of a horizontal indicative straight line, and each red sub-pixel between two adjacent pairs of the green sub-pixels is arranged at a side of the horizontal indicative straight line identical to the green sub-pixels at different sides of the red sub-pixel; in each even-numbered row of the pixel array, the green sub-pixels of each pair of the green sub-pixels are arranged at the same side of a horizontal indicative straight line, every two adjacent pairs of the green sub-pixels are arranged at different sides of the horizontal indicative straight line, and each red sub-pixel between two adjacent pairs of the green sub-pixels is arranged at the horizontal indicative straight line; in each column of the pixel array, the green sub-pixels of each pair of the green sub-pixels are arranged at different sides of a vertical indicative straight line, and each blue sub-pixel between two adjacent pairs of the green sub-pixels is arranged at a side of the vertical indicative straight line identical to the green sub-pixel included in the same pixel as the blue sub-pixel.

Optionally, one blue sub-pixel and one red sub-pixel is arranged between every two adjacent pairs of the green sub-pixels in the first direction; wherein the blue sub-pixels and the red sub-pixels are arranged along the second direction.

Optionally, the first direction is a horizontal direction and the second direction is a vertical direction; in each row of the pixel array, all the green sub-pixels are arranged at a horizontal indicative straight line; in each column of the pixel array, every two adjacent green sub-pixels are arranged at different sides of vertical indicative straight line; wherein the red sub-pixel and the blue sub-pixel are arranged between every two adjacent vertical indicative straight lines and at different sides of each horizontal indicative straight line respectively.

Optionally, in the second direction, every two adjacent red sub-pixels are arranged in pairs, and every two adjacent blue sub-pixels are arranged in pairs; wherein each pair of the green sub-pixels in the first direction is surrounded by two pairs of the red sub-pixels and two pairs of the blue sub-pixels.

Optionally, every two blue sub-pixels arranged in pairs are combined as one blue sub-pixel and driven by one drive circuit.

Optionally, every two red sub-pixels arranged in pairs are combined as one red sub-pixel and driven by one drive circuit.

Optionally, the first direction is a horizontal direction and the second direction is a vertical direction; in each row of the pixel array, all the green sub-pixels are arranged at a horizontal indicative straight line; in each column of the pixel array, every two adjacent green sub-pixels are arranged at different sides of a vertical indicative straight line; each pair of the red sub-pixels is arranged between every two adjacent vertical indicative straight lines, and the red sub-pixels of each pair of the red sub-pixels are arranged at different sides of the horizontal indicative straight line in each even-numbered row respectively; each pair of the blue sub-pixels is arranged between every two adjacent vertical indicative straight lines, and the blue sub-pixels of each pair of the blue sub-pixels are arranged at different sides of the horizontal indicative straight line in each odd-numbered row respectively.

In a second aspect, a display panel is provided, which includes pixels arranged according to the pixel arrangement structure hereinabove.

In a third aspect, a display device is provided, including the display panel hereinabove.

A display panel and a display device are provided by some embodiments of the present disclosure, including a plurality of first sub-pixels, a plurality of second sub-pixels and a plurality of third sub-pixels; each pixel includes one first sub-pixel, each second sub-pixel is shared by at least two adjacent pixels and each third sub-pixel is shared by at least two adjacent pixels; a density of the sub-pixels is 1.5 times larger than a density of the pixels in a first direction of a pixel array, and a density of the sub-pixels is 1.5 times larger than a density of the pixels in a second direction of the pixel array; wherein the first direction is different from the second direction. The density of the sub-pixels is 1.5 times larger than the density of the pixels in both the first and the second directions, compared with the related art according to which a density of the sub-pixels is twice a density of the pixels in one direction and the density of the sub-pixels is equal to the density of the pixels in another direction, the amounts of the sub-pixels in both the two directions are balanced in some embodiments of the present disclosure, thereby avoiding that too many sub-pixels exist in one direction. Therefore, when the pixel arrangement structure is applied to a display panel, a manufacture process of the display panel may be simpler.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DRAWING REFERENCE NUMBER

10—pixel;
101—green sub-pixel;
102—red sub-pixel;
103—blue sub-pixel.

DETAILED DESCRIPTION

The present disclosure will be described hereinafter in a clear and complete manner in conjunction with the drawings related in the embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

A pixel arrangement structure is provided by some embodiments of the present disclosure, including a plurality of first sub-pixels, a plurality of second sub-pixels and a plurality of third sub-pixels. Each pixel includes one first sub-pixel, each second sub-pixel is shared by at least two adjacent pixels and each third sub-pixel is shared by at least two adjacent pixels. A density of the sub-pixels is 1.5 times larger than a density of the pixels in a first direction of a pixel array, and a density of the sub-pixels is 1.5 times larger than a density of the pixels in a second direction of the pixel array. The first direction is different from the second direction.

It should be noted that, firstly, the pixel arrangement structure provided by some embodiments of the present disclosure may be applied to any display device (e.g., liquid crystal display (LCD), organic light-emitting diode (OLED)) including three sub-pixels such as red, green and blue sub-pixels.

Secondly, the second sub-pixel in each pixel is shared by adjacent pixels and the third sub-pixel in each pixel is shared by adjacent pixels, so the pixel in some embodiments of the present disclosure is not proper to a pixel defined completely by a first sub-pixel, a second sub-pixel and a third sub-pixel. Therefore, the pixel in the present disclosure is called a virtual pixel.

Each second sub-pixel is shared by adjacent pixels and each third sub-pixel is shared by adjacent pixels, so a boundary of each virtual pixel is very vague. Therefore, a shape of the pixel is not limited in the embodiments of the present disclosure.

Thirdly, those skilled in the art should understand that the pixels and the first sub-pixels, the second sub-pixels and the third sub-pixels of the pixels in the pixel arrangement structure provided by some embodiments of the present disclosure should be arranged as distributed as possible.

Fourthly, both the first and the second directions indicated in the drawings of some embodiments of the present disclosure are indicated from macro perspectives. In another word, in order to realize that the density of the sub-pixels is 1.5 times larger than a density of the pixels and to uniformly distribute the pixels and the sub-pixels of the pixels, the first direction from micro perspectives may be a wavy line rather than exactly a straight line. In a similar way, the second direction is as the description hereinabove.

Optionally, the first direction is a horizontal direction and the second direction is a vertical direction.

A pixel arrangement structure is provided by some embodiments of the present disclosure, including a plurality of first sub-pixels, a plurality of second sub-pixels and a plurality of third sub-pixels. Each pixel includes one first sub-pixel, each second sub-pixel is shared by at least two adjacent pixels and each third sub-pixel is shared by at least two adjacent pixels. A density of the sub-pixels is 1.5 times larger than a density of the pixels in a first direction of a pixel array, and a density of the sub-pixels is 1.5 times larger than a density of the pixels in a second direction of the pixel array. The first direction is different from the second direction. The density of the sub-pixels is 1.5 times larger than the density of the pixels in both the first and the second directions, compared with the related art according to which a density of the sub-pixels is twice a density of the pixels in one direction and the density of the sub-pixels is equal to the density of the pixels in another direction, the amounts of the sub-pixels in both the two directions are balanced in some embodiments of the present disclosure, thereby avoiding that too many sub-pixels exist in one direction. Therefore, when the pixel arrangement structure is applied to a display panel, a manufacture process of the display panel may be simpler.

Optionally, as shown in FIG. 2-FIG. 7, the first sub-pixel is a green sub-pixel 101, the second sub-pixel is a red sub-pixel 102, and the third sub-pixel is a blue sub-pixel 103.

In another word, the pixel arrangement structure includes a plurality of red sub-pixels 102, a plurality of green sub-pixels 101 and a plurality of blue sub-pixels 103. Each pixel 10 includes one green sub-pixel 101, each red sub-pixel 102 is shared by at least two adjacent pixels 10 and each blue sub-pixel 103 is shared by at least two adjacent pixels 10. The density of the sub-pixels is 1.5 times larger than the density of the pixels in the first direction of the pixel array, and the density of the sub-pixels is 1.5 times larger than the density of the pixels in the second direction of the pixel array. The first direction is different from the second direction.

It should be noted that, firstly, the red sub-pixel 102 in each pixel 10 is shared by adjacent pixels 10 and the blue sub-pixel 103 in each pixel 10 is shared by adjacent pixels 10, so the pixel 10 in some embodiments of the present disclosure is not proper to a pixel defined completely by a first sub-pixel, a second sub-pixel and a third sub-pixel. Therefore, the pixel 10 in the present disclosure is called a virtual pixel 10.

The red sub-pixel 102 is shared by adjacent pixels 10 and the blue sub-pixel 103 is shared by adjacent pixels 10, so a boundary of each virtual pixel 10 is very vague. Therefore, a shape of the pixel 10 is not limited in the embodiments of the present disclosure.

Secondly, those skilled in the art should understand that, in a case of a high resolution ratio, the green sub-pixel 101 is decisive for a sensed luminance center position of each pixel 10. Therefore, according to some embodiments of the present disclosure, the green sub-pixels 101 of the pixels 10 should be distributed uniformly.

According to some embodiments of the present disclosure, the density of the sub-pixels is 1.5 times larger than the density of the pixels in both the first and the second directions, so the green sub-pixels 101 are not easy to be distributed at equal intervals at all the parts. Based on this, according to some embodiments of the present disclosure, relative positions of the green sub-pixels 101 may be fine-adjusted to distribute the green sub-pixels 101 uniformly in a scope of more than three pixel intervals.

Based on this, the red sub-pixel 102 shared by two adjacent pixels 10 and the green sub-pixels 101 in the two adjacent pixels 10 may be distributed uniformly, and the blue sub-pixel 103 shared by two adjacent pixels 10 and the green sub-pixels 101 in the two adjacent pixels 10 may be distributed uniformly.

Furthermore, as shown in FIG. 2 to FIG. 7, each two adjacent green sub-pixels 101 are arranged in pairs in the first direction, and at least one sub-pixel of a color other than green is arranged between every two adjacent pairs of the green sub-pixels 101.

In another word, all the green sub-pixels 101 in the first direction are arranged in pairs, and the green sub-pixels 101 in each pairs are adjacent to each other. The at least one sub-pixel of a color other than green may be a red sub-pixel 102 or a blue sub-pixel 103. The at least one sub-pixel of a color other than green may be two red sub-pixels 102 or two blue sub-pixels 103, or the at least one sub-pixel of a color other than green may be a red sub-pixel 102 and a blue sub-pixel 103, which is not limited herein.

It should be noted that, when at least one sub-pixel of a color other than green is arranged between every two adjacent pairs of the green sub-pixels 101, the density of the sub-pixels needs to be 1.5 times larger than the density of the pixels in both the first and the second directions.

Each pixel 10 includes a green sub-pixel 101, so the density of the green sub-pixels 101 may be increased accordingly. Based on this, when the pixel arrangement structure is applied to an OLED and a color layer forming the green sub-pixels 101 is a color filtering layer or a light-emitting layer, the process is difficult. According to some embodiments of the present disclosure, all the green sub-pixels 101 in the first direction are arranged in pairs which are adjacent to each other. When the OLED is manufactured by FMM evaporation, the color layers of the two green sub-pixels 101 in each pair may be connected to each other, and then green light-emitting layers of the two green sub-pixels 101 in each pair may be formed by a via-hole, thereby simplifying a manufacturing process of the color layers of the green sub-pixels 101 to some extent.

Based on the above description, there may be some cases as follows.

Figure 2:
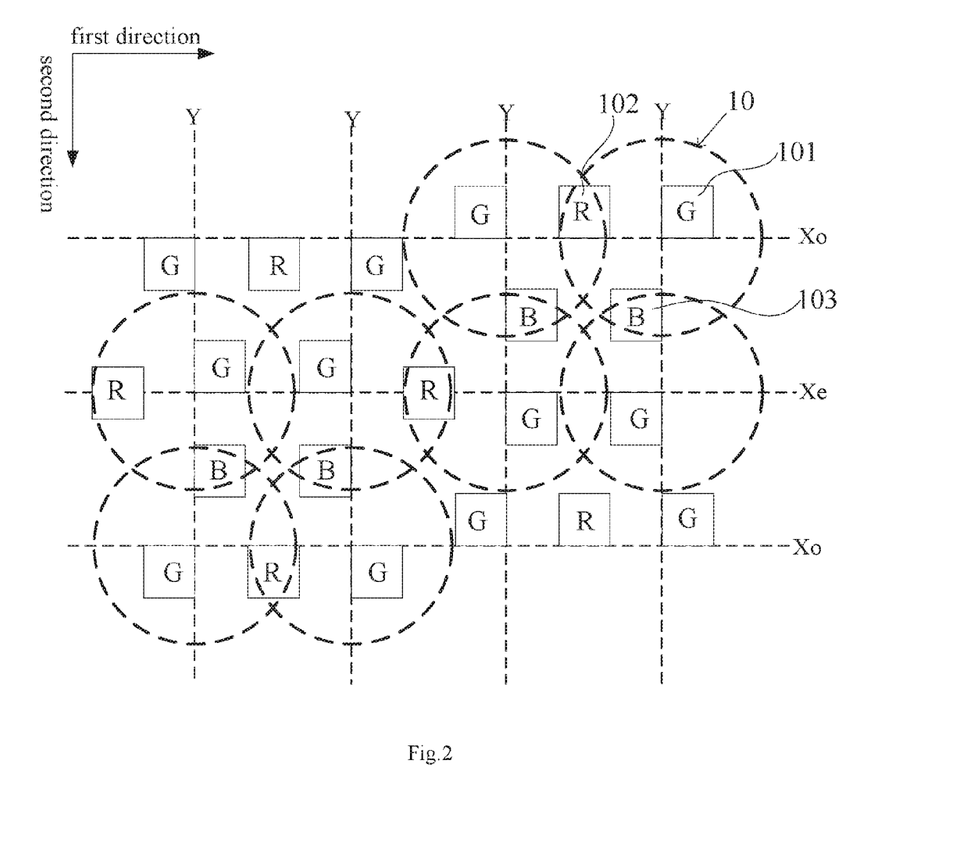
FIG. 2 is a schematic view 1 showing an arrangement of red, green and blue sub-pixels in a pixel arrangement structure provided by some embodiments of the present disclosure.
Figure 3:
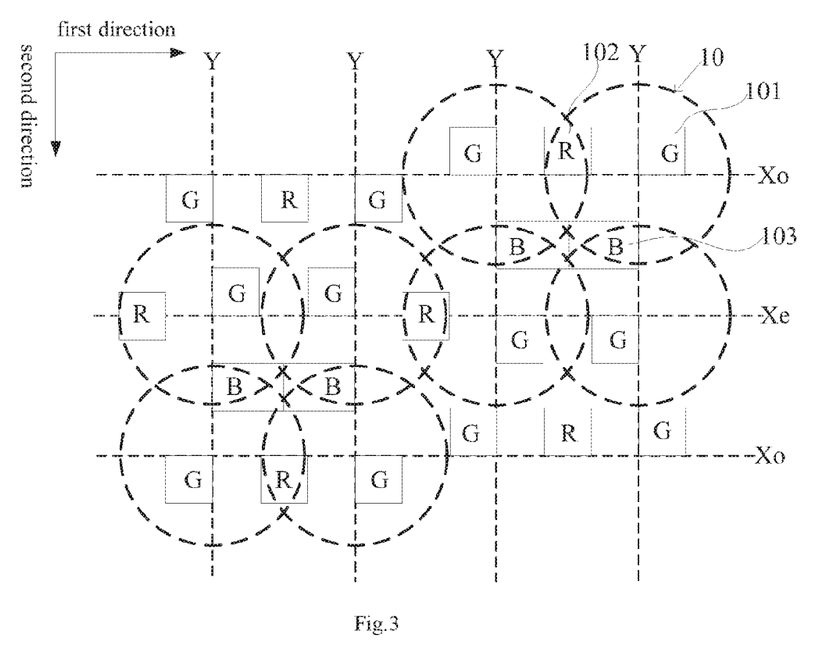
FIG. 3 is a schematic view 2 showing an arrangement of red, green and blue sub-pixels in a pixel arrangement structure provided by some embodiments of the present disclosure.

Case 1: as shown in FIG. 2 to FIG. 3, a red sub-pixel 102 or a blue sub-pixel 103 is arranged between every two adjacent pairs of the green sub-pixels 101.

Figure 4:
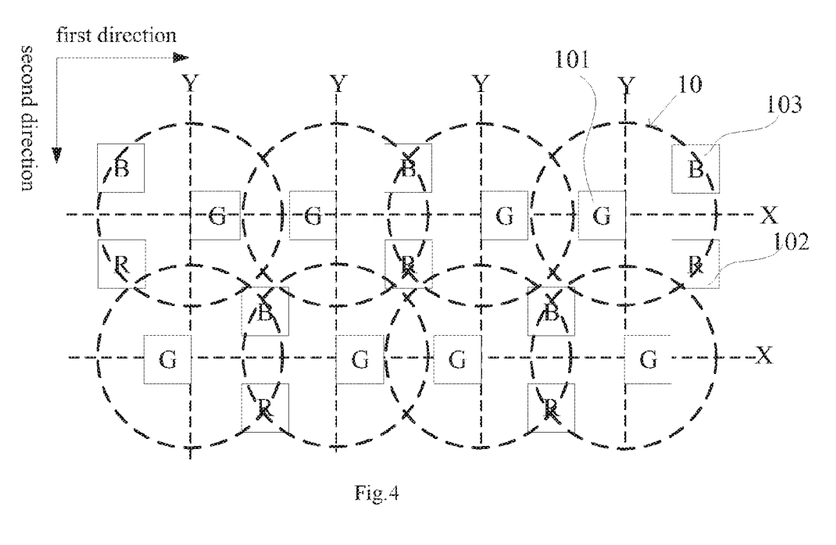
FIG. 4 is a schematic view 3 showing an arrangement of red, green and blue sub-pixels in a pixel arrangement structure provided by some embodiments of the present disclosure.

Case 2: as shown in FIG. 4, a red sub-pixel 102 and a blue sub-pixel 103 are arranged between every two adjacent pairs of the green sub-pixels 101.

Figure 5:
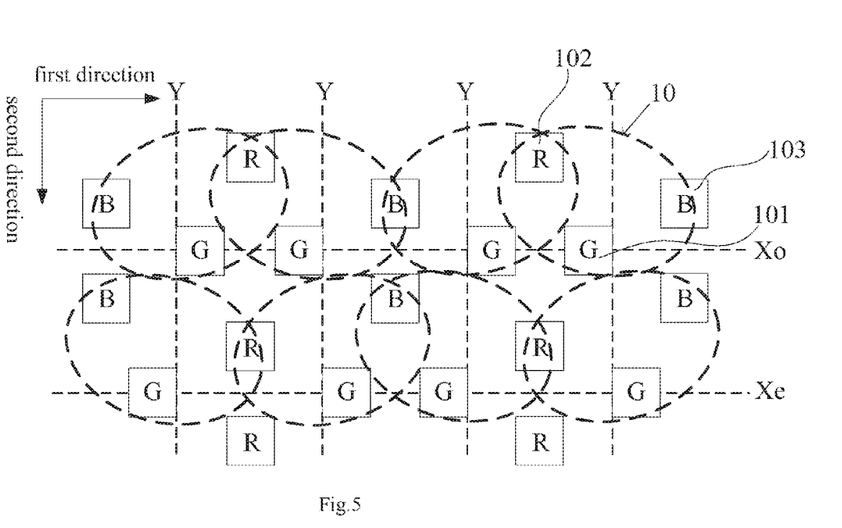
FIG. 5 is a schematic view 4 showing an arrangement of red, green and blue sub-pixels in a pixel arrangement structure provided by some embodiments of the present disclosure.
Figure 6:
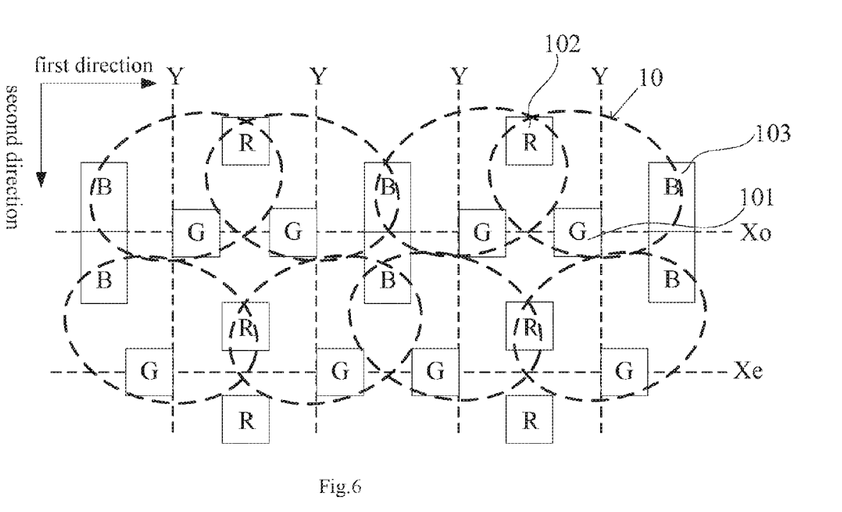
FIG. 6 is a schematic view 5 showing an arrangement of red, green and blue sub-pixels in a pixel arrangement structure provided by some embodiments of the present disclosure.
Figure 7:
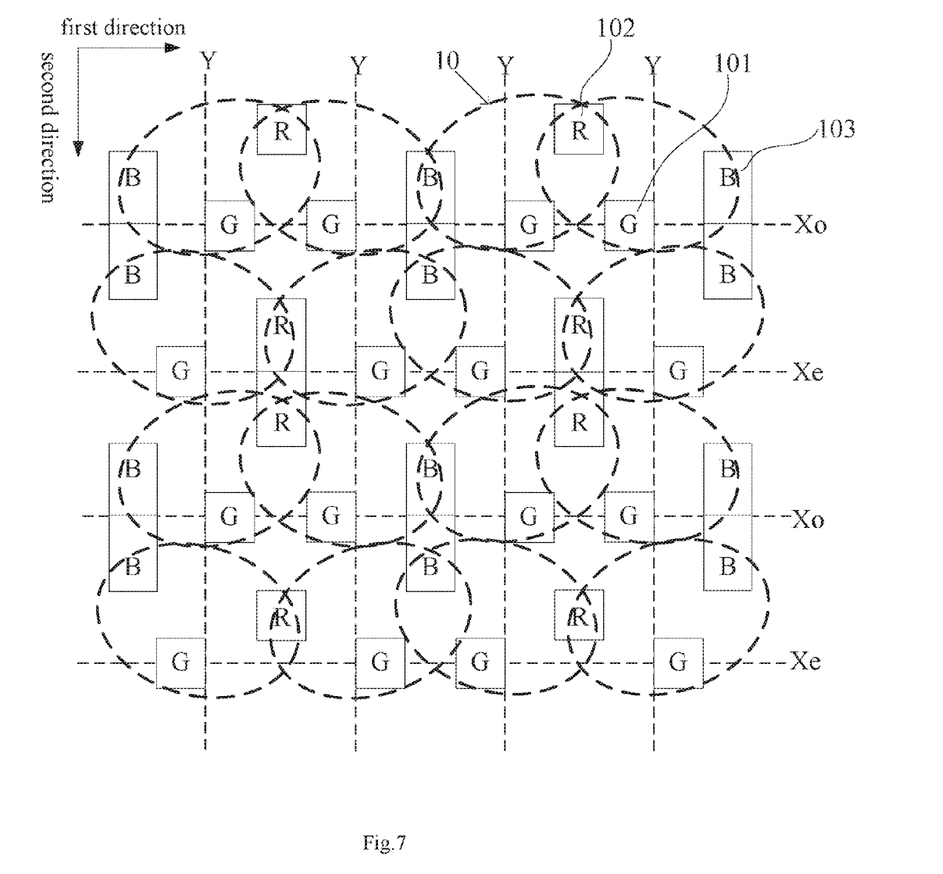
FIG. 7 is a schematic view 6 showing an arrangement of red, green and blue sub-pixels in a pixel arrangement structure provided by some embodiments of the present disclosure.

Case 3: as shown in FIG. 5 to FIG. 7, two red sub-pixel 102 or two blue sub-pixels 103 are arranged between every two adjacent pairs of the green sub-pixels 101.

In case 1, as shown in FIG. 2 and FIG. 3, every two adjacent green sub-pixels 101 are arranged in pairs in the first and the second directions. One red sub-pixel 102 is arranged between every two adjacent pairs of the green sub-pixels 101 in the first direction, and one blue sub-pixel 103 is arranged between every two adjacent pairs of the green sub-pixels 101 in the second direction.

In another word, in the first direction, all the green sub-pixels 101 are arranged in pairs, and the green sub-pixels 101 in each pair are adjacent to each other. In the second direction, all the green sub-pixels 101 are arranged in pairs, and the green sub-pixels 101 in each pair are adjacent to each other. One red sub-pixel 102 may be arranged between every two adjacent pairs of the green sub-pixels 101 in the first direction, and one blue sub-pixel 103 may be arranged between every two adjacent pairs of the green sub-pixels 101 in the second direction.

Of course, the red sub-pixel 102 may be replaced by a blue sub-pixel 103. That is, one blue sub-pixel 103 is arranged between every two adjacent pairs of the green sub-pixels 101 in the first direction, and one blue sub-pixel 103 is arranged between every two adjacent pairs of the green sub-pixels 101 in the second direction.

In both the first and the second directions, the red sub-pixel 102 and the blue sub-pixel 103 are both arranged between two adjacent pairs of the green sub-pixels 101, so the density of the sub-pixels may be 1.5 times larger than the density of the pixels. A proportion of the amount of the red sub-pixels 102, the green sub-pixels 101 and the blue sub-pixels 103 is 1:2:1.

Furthermore, as shown in FIG. 3, every two adjacent blue sub-pixels 103 are arranged in pairs.

In one aspect, when the pixel arrangement structure is applied to an OILED and the OLED is manufactured by FMM evaporation, color layers of the two adjacent blue sub-pixels 103 may be connected to each other, and then blue light-emitting layers of the two adjacent blue sub-pixels 103 may be formed by a via-hole, thereby simplifying a manufacturing process.

In another aspect, the human eyes are least sensitive to the position of the blue sub-pixel 103, and a luminance effect of the blue sub-pixel 103 is also the least, so in a case of a high resolution ratio more than 300 ppi for example, the two adjacent blue sub-pixels 103 may be combined as one blue sub-pixel 103 without influencing a display effect.

In another word, every two adjacent blue sub-pixels 103 are combined as one blue sub-pixel and driven by one drive circuit. The drive circuit may be a thin film transistor and a relevant circuit connected to the thin film transistor.

As such, a manufacturing process of the drive circuit may be simplified.

It should be noted that, although every two adjacent blue sub-pixels 103 are combined as one blue sub-pixel 103, the combined blue sub-pixel 103 still occupies a space of two blue sub-pixels 103. Therefore, the combined blue sub-pixel 103 is still regarded as two blue sub-pixels 103 when calculating the density of the sub-pixels and the density of the pixels.

In addition, it can be seen from FIG. 2, each blue sub-pixel 103 is shared by two adjacent pixels. When every two adjacent blue sub-pixels 103 are combined as one blue sub-pixel 103, the combined blue sub-pixel 103 may be regarded as being shared by two adjacent pixels 10.

A pixel arrangement structure is provided by some embodiments of the present disclosure. As shown in FIG. 2, the first direction is a horizontal direction and the second direction is a vertical direction. In each odd-numbered row of the pixel array, the green sub-pixels 101 of each pair of the green sub-pixels 101 are arranged at different sides of a horizontal indicative straight line Xo, and each red sub-pixel 102 between two adjacent pairs of the green sub-pixels 101 is arranged at a side of the horizontal indicative straight line Xo identical to the green sub-pixels 101 at different sides of the red sub-pixel. In each even-numbered row of the pixel array, the green sub-pixels 101 of each pair of the green sub-pixels 101 are arranged at the same side of a horizontal indicative straight line Xe, every two adjacent pairs of the green sub-pixels 101 are arranged at different sides of the horizontal indicative straight line Xe, and each red sub-pixel 102 between two adjacent pairs of the green sub-pixels 101 is arranged at the horizontal indicative straight line Xe. In each column of the pixel array, the green sub-pixels 101 of each pair of the green sub-pixels 101 are arranged at different sides of a vertical indicative straight line Y, and each blue sub-pixel 103 between two adjacent pairs of the green sub-pixels 101 is arranged at a side of the vertical indicative straight line Y identical to the green sub-pixel 101 included in the same pixel as the blue sub-pixel 103.

It should be noted that, first, the horizontal indicative straight lines Xo/Xe and the vertical indicative straight line Y do not exist actually, which are merely to describe a position of each sub-pixel. The horizontal indicative straight lines Xo/Xe and the vertical indicative straight line Y form grid lines of the pixel array.

Secondly, in the embodiments and the relevant drawings of the present disclosure, the horizontal indicative straight lines at the odd-numbered rows of the pixel array are marked as Xo, the horizontal indicative straight lines at the even-numbered rows of the pixel array are marked as Xe, and the vertical indicative straight lines at the columns of the pixel array are marked as Y.

In case 2, as shown in FIG. 4, a red sub-pixel 102 and a blue sub-pixel 103 are arranged between every two adjacent pairs of the green sub-pixels 101. The red sub-pixels 102 and the blue sub-pixels 103 are arranged in the second direction.

The two adjacent green sub-pixels 101 are arranged in pairs only in the first direction.

As shown in FIG. 4, the sub-pixels are arranged circularly in an order of green sub-pixel 101, green sub-pixel 101, red sub-pixel 102 or blue sub-pixel 103, so the density of the sub-pixels is 1.5 times larger than the density of the pixels in the first direction. The sub-pixels are arranged circularly in an order of red sub-pixel 102, blue sub-pixel 103, green sub-pixel 101, so the density of the sub-pixels is 1.5 times larger than the density of the pixels in the second direction. A proportion of the amount of the red sub-pixels 102, the green sub-pixels 101 and the blue sub-pixels 103 is 1:2:1.

A pixel arrangement structure is provided by some embodiments of the present disclosure. The first direction is a horizontal direction and the second direction is a vertical direction. In each row of the pixel array, all the green sub-pixels 101 are arranged at a horizontal indicative straight line X. In each column of the pixel array, every two adjacent green sub-pixels 101 are arranged at different sides of a vertical indicative straight line Y. The red sub-pixel 102 and the blue sub-pixel 103 between every two adjacent pairs of the green sub-pixels 101 are arranged between every two adjacent vertical indicative straight lines Y and at different sides of each horizontal indicative straight line X respectively.

It should be noted that, first, the horizontal indicative straight line X and the vertical indicative straight line Y do not exist actually, which are merely to describe a position of each sub-pixel. The horizontal indicative straight line X and the vertical indicative straight line Y form grid lines of the pixel array.

Secondly, in the embodiments and the relevant drawings of the present disclosure, the horizontal indicative straight lines at the rows of the pixel array are marked as X, and the vertical indicative straight lines at the columns of the pixel array are marked as Y.

In case 3, as shown in FIG. 5 to FIG. 7, in the second direction, every two adjacent red sub-pixels 102 are arranged in pairs, and every two adjacent blue sub-pixels 103 are arranged in pairs. Each pair of the green sub-pixels 101 in the first direction is surrounded by two pairs of the red sub-pixels 102 and two pairs of the blue sub-pixels 103.

Each pair of the green sub-pixels 101 in the first direction is surrounded by two pairs of the red sub-pixels 102 and two pairs of the blue sub-pixels 103. That is, two pairs of the blue sub-pixels 103 or two pairs of the red sub-pixels 102, or one pair of the blue sub-pixels 103 and one pair of the red sub-pixels 102, are arranged at a left and a right sides of the pair of the green sub-pixels 101; two pairs of the blue sub-pixels 103 or two pairs of the red sub-pixels 102, or one pair of the blue sub-pixels 103 and one pair of the red sub-pixels 102, are arranged at an upper and a lower sides of the pair of the green sub-pixels 101.

The pairs of blue sub-pixels 103 or the pairs of the red sub-pixels 102, whether arranged at the left and the right sides of the pair of the green sub-pixels 101 or at the upper and the lower sides thereof, are all arranged between every two adjacent pairs of the green sub-pixels 101.

According to some embodiments of the present disclosure, every two adjacent blue sub-pixels 103 are arranged in pairs, and every two adjacent red sub-pixels 102 are arranged in pairs. When the pixel arrangement structure is applied to an OLED and the OLED is manufactured by FMM evaporation, the color layers of the two blue sub-pixels 103 in each pair the color layers of the red blue sub-pixels 102 in each pair may be connected to each other, and then blue light-emitting layers of the two blue sub-pixels 103 in each pair may be formed by a via-hole and red light-emitting layers of the two red sub-pixels 102 in each pair may be formed by a via-hole, thereby simplifying a manufacturing process of the color layers of the blue sub-pixels 103 and the red sub-pixels 102 to some extent.

As such, the density of the sub-pixels is 1.5 times larger than the density of the pixels in both the first and the second directions. A proportion of the amount of the red sub-pixels 102, the green sub-pixels 101 and the blue sub-pixels 103 is 1:2:1.

Furthermore, every two adjacent blue sub-pixels 103 are combined as one blue sub-pixel and driven by one drive circuit.

The human eyes are least sensitive to the position of the blue sub-pixel 103, and a luminance effect of the blue sub-pixel 103 is also the least, so in a case of a high resolution ratio more than 300 ppi for example, the two adjacent blue sub-pixels 103 may be combined as one blue sub-pixel 103 without influencing a display effect, and the two adjacent blue sub-pixels 103 may be driven by one drive circuit, thereby simplifying a manufacturing process of the drive circuit.

Furthermore, every adjacent red sub-pixels 102 are combined as one red sub-pixel and driven by one drive circuit.

As such, the manufacturing process of the drive circuit may be simplified further.

It should be noted that, although every two adjacent blue sub-pixels 103 are combined as one blue sub-pixel 103, the combined blue sub-pixel 103 still occupies a space of two blue sub-pixels 103. Therefore, the combined blue sub-pixel 103 is still regarded as two blue sub-pixels 103 when calculating the density of the sub-pixels and the density of the pixels.

The same principle is appropriate for the two adjacent red sub-pixels 102.

A pixel arrangement structure is provided by some embodiments of the present disclosure. As shown in FIG. 5, the first direction is a horizontal direction and the second direction is a vertical direction. In each row of the pixel array, all the green sub-pixels 101 are arranged at horizontal indicative straight lines Xo/Xe. In each column of the pixel array, every two adjacent green sub-pixels 101 are arranged at different sides of a vertical indicative straight line Y. Each pair of the red sub-pixels 102 is arranged between every two adjacent vertical indicative straight lines Y, and the red sub-pixels 102 of each pair of the red sub-pixels 102 are arranged at different sides of the horizontal indicative straight line Xe in each even-numbered row respectively. Each pair of the blue sub-pixels 103 is arranged between every two adjacent vertical indicative straight lines Y, and the blue sub-pixels 103 of each pair of the blue sub-pixels 103 are arranged at different sides of the horizontal indicative straight line Xo in each odd-numbered row respectively.

It should be noted that, first, the horizontal indicative straight lines Xo/Xe and the vertical indicative straight line Y do not exist actually, which are merely to describe a position of each sub-pixel. The horizontal indicative straight lines Xo/Xe and the vertical indicative straight line Y form grid lines of the pixel array.

Secondly, in the embodiments and the relevant drawings of the present disclosure, the horizontal indicative straight lines at the odd-numbered rows of the pixel array are marked as Xo, the horizontal indicative straight lines at the even-numbered rows of the pixel array are marked as Xe, and the vertical indicative straight lines at the columns of the pixel array are marked as Y.

A display panel is provided by some embodiments of the present disclosure, wherein pixels of the display panel are arranged according to the pixel arrangement structure hereinabove.

A display device is further provided by some embodiments of the present disclosure, including the display panel hereinabove.

The pixel arrangement structure provided by some embodiments of the present disclosure may be applied to any display device (e.g., liquid crystal display (LCD), organic light-emitting diode (OLED)) including three sub-pixels such as red, green and blue sub-pixels.

The above are merely the preferred embodiments of the present disclosure, and a scope of the present disclosure is not limited herein. A person skilled in the art may make further modifications and replacements, and these modifications and replacements shall also fall within the scope of the present disclosure. Therefore, the attached claims are include the scope of the present disclosure.

What is claimed is:

1. A pixel arrangement structure, comprising a plurality of first sub-pixels, a plurality of second sub-pixels and a plurality of third sub-pixels;
    wherein each pixel comprises one first sub-pixel, each second sub-pixel is shared by at least two adjacent pixels and each third sub-pixel is shared by at least two adjacent pixels;
    wherein a density of the sub-pixels is 1.5 times larger than a density of the pixels in a first direction of a pixel array, and a density of the sub-pixels is 1.5 times larger than a density of the pixels in a second direction of the pixel array;
    wherein the first direction is different from the second direction, and the first sub-pixel is a green sub-pixel, the second sub-pixel is a red sub-pixel, and the third sub-pixel is a blue sub-pixel.

2. The pixel arrangement structure according to claim 1, wherein the first direction is a horizontal direction and the second direction is a vertical direction.

3. The pixel arrangement structure according to claim 1, wherein every two adjacent green sub-pixels are arranged in pairs in the first direction;
    wherein at least one sub-pixel of a color other than green is arranged between every two adjacent pairs of the green sub-pixels.

4. The pixel arrangement structure according to claim 3, wherein two adjacent green sub-pixels are arranged in pairs in the second direction;
    one red sub-pixel is arranged between every two adjacent pairs of the green sub-pixels in the first direction, and one blue sub-pixel is arranged between every two adjacent pairs of the green sub-pixels in the second direction.

5. The pixel arrangement structure according to claim 4, wherein every two adjacent blue sub-pixels are arranged in pairs.

6. The pixel arrangement structure according to claim 5, wherein every two adjacent blue sub-pixels are combined as one blue sub-pixel and driven by one drive circuit.

7. The pixel arrangement structure according to claim 4, wherein the first direction is a horizontal direction and the second direction is a vertical direction;
    in each odd-numbered row of the pixel array, the green sub-pixels of each pair of the green sub-pixels are arranged at different sides of a horizontal indicative straight line, and each red sub-pixel between two adjacent pairs of the green sub-pixels is arranged at a side of the horizontal indicative straight line identical to the green sub-pixels at different sides of the red sub-pixel;
    in each even-numbered row of the pixel array, the green sub-pixels of each pair of the green sub-pixels are arranged at the same side of a horizontal indicative straight line, every two adjacent pairs of the green sub-pixels are arranged at different sides of the horizontal indicative straight line, and each red sub-pixel between two adjacent pairs of the green sub-pixels is arranged at the horizontal indicative straight line;
    in each column of the pixel array, the green sub-pixels of each pair of the green sub-pixels are arranged at different sides of a vertical indicative straight line, and each blue sub-pixel between two adjacent pairs of the green sub-pixels is arranged at a side of the vertical indicative straight line identical to the green sub-pixel comprised in the same pixel as the blue sub-pixel.

8. The pixel arrangement structure according to claim 3, wherein one blue sub-pixel and one red sub-pixel is arranged between every two adjacent pairs of the green sub-pixels in the first direction;
    wherein the blue sub-pixels and the red sub-pixels are arranged in the second direction.

9. The pixel arrangement structure according to claim 8, wherein the first direction is a horizontal direction and the second direction is a vertical direction;
    in each row of the pixel array, all the green sub-pixels are arranged at a horizontal indicative straight line;
    in each column of the pixel array, every two adjacent green sub-pixels are arranged at different sides of a vertical indicative straight line;
    wherein the red sub-pixel and the blue sub-pixel are arranged between every two adjacent vertical indicative straight lines and at different sides of each horizontal indicative straight line respectively.

10. The pixel arrangement structure according to claim 3, wherein, in the second direction, every two adjacent red sub-pixels are arranged in pairs, and every two adjacent blue sub-pixels are arranged in pairs;
    wherein each pair of the green sub-pixels in the first direction is surrounded by two pairs of the red sub-pixels and two pairs of the blue sub-pixels.

11. The pixel arrangement structure according to claim 10, wherein every two blue sub-pixels arranged in pairs are combined as one blue sub-pixel and driven by one drive circuit.

12. The pixel arrangement structure according to claim 10, wherein every two red sub-pixels arranged in pairs are combined as one red sub-pixel and driven by one drive circuit.

13. The pixel arrangement structure according to claim 10, wherein the first direction is a horizontal direction and the second direction is a vertical direction;
    in each row of the pixel array, all the green sub-pixels are arranged at a horizontal indicative straight line;
    in each column of the pixel array, every two adjacent green sub-pixels are arranged at different sides of a vertical indicative straight line;
    each pair of the red sub-pixels is arranged between every two adjacent vertical indicative straight lines, and the red sub-pixels of each pair of the red sub-pixels are arranged at different sides of the horizontal indicative straight line in each even-numbered row respectively;
    each pair of the blue sub-pixels is arranged between every two adjacent vertical indicative straight lines, and the blue sub-pixels of each pair of the blue sub-pixels are arranged at different sides of the horizontal indicative straight line in each odd-numbered row respectively.

14. A display panel comprising pixels which are arranged according to the pixel arrangement structure according to claim 1.

15. A display device, comprising the display panel according to claim 14.

* * * * *